US010784016B2

(12) United States Patent
Tokumoto et al.

(10) Patent No.: US 10,784,016 B2
(45) Date of Patent: Sep. 22, 2020

(54) INTRINSICALLY SAFE EXPLOSION-PROOF COMPOUND CABLE, SIGNAL PROCESSOR PROVIDED WITH THE INTRINSICALLY SAFE EXPLOSION-PROOF COMPOUND CABLE, TEACH PENDANT PROVIDED WITH THE INTRINSICALLY SAFE EXPLOSION-PROOF COMPOUND CABLE, AND ROBOT PROVIDED WITH THE INTRINSICALLY SAFE EXPLOSION-PROOF COMPOUND CABLE

(71) Applicant: KAWASAKI JUKOGYO KABUSHIKI KAISHA, Kobe-shi, Hyogo (JP)

(72) Inventors: Akihiro Tokumoto, Kobe (JP); Kazuhiro Uekita, Nishinomiya (JP)

(73) Assignee: KAWASAKI JUKOGYO KABUSHIKI KAISHA, Kobe-shi (JP)

( * ) Notice: Subject to any disclaimer, the term of this patent is extended or adjusted under 35 U.S.C. 154(b) by 0 days.

(21) Appl. No.: 16/338,261

(22) PCT Filed: Oct. 25, 2017

(86) PCT No.: PCT/JP2017/038496
§ 371 (c)(1),
(2) Date: Mar. 29, 2019

(87) PCT Pub. No.: WO2018/079593
PCT Pub. Date: May 3, 2018

(65) Prior Publication Data
US 2020/0035380 A1 Jan. 30, 2020

(30) Foreign Application Priority Data

Oct. 27, 2016 (JP) .................................. 2016-210258

(51) Int. Cl.
*H01B 7/00* (2006.01)
*H01B 7/18* (2006.01)
(Continued)

(52) U.S. Cl.
CPC .............. *H01B 7/18* (2013.01); *B25J 9/0009* (2013.01); *H01B 11/002* (2013.01); *H05K 9/0098* (2013.01)

(58) Field of Classification Search
CPC ... H01B 7/02; H01B 7/04; H01B 7/06; H01B 7/18; H01B 11/02; H01B 11/002
(Continued)

(56) References Cited

U.S. PATENT DOCUMENTS 6,448,500 B1    9/2002  Hosaka et al.
9,799,424 B2 *  10/2017 Heipel ..................... H01B 7/04
(Continued)

FOREIGN PATENT DOCUMENTS

CN    1352799 A     6/2002
JP    S64-20986 A   1/1989
(Continued)

*Primary Examiner* — William H. Mayo, III
(74) *Attorney, Agent, or Firm* — Oliff PLC

(57) ABSTRACT

An intrinsically safe explosion-proof compound cable includes a plurality of unit cables. Each of the unit cables is configured to transmit a signal or power. The plurality of unit cables include one or more shielded cables each having a shield layer and one or more unshielded cables without the shield layer. At least a highest-frequency unit cable that is the unit cable configured to transmit the signal or power at the highest frequency among the plurality of unit cables is the unshielded cable.

11 Claims, 4 Drawing Sheets

(51) Int. Cl.
*B25J 9/00* (2006.01)
*H01B 11/00* (2006.01)
*H05K 9/00* (2006.01)

(58) Field of Classification Search
USPC ...... 174/102 R, 108, 109, 110 R, 112, 113 R
See application file for complete search history.

(56) References Cited

U.S. PATENT DOCUMENTS

| | | | | |
|---|---|---|---|---|
| 2010/0051318 A1* | 3/2010 | Wang | ..................... | H01B 11/12 |
| | | | | 174/113 R |
| 2010/0084157 A1* | 4/2010 | Wang | ..................... | H01B 11/12 |
| | | | | 174/107 |
| 2010/0258333 A1* | 10/2010 | Horan | ................ | H01B 11/1091 |
| | | | | 174/78 |
| 2011/0162866 A1* | 7/2011 | Masakazu | ............ | H01B 11/002 |
| | | | | 174/103 |
| 2011/0278043 A1* | 11/2011 | Ueda | .................... | H01B 7/1895 |
| | | | | 174/115 |
| 2012/0008904 A1* | 1/2012 | Han | ..................... | G02B 6/4416 |
| | | | | 385/101 |
| 2012/0008906 A1* | 1/2012 | Han | ..................... | G02B 6/4416 |
| | | | | 385/101 |
| 2013/0223315 A1 | 8/2013 | Yoshida et al. | | |
| 2013/0333917 A1* | 12/2013 | Tanabe | .................. | H01B 7/048 |
| | | | | 174/113 R |
| 2014/0216781 A1* | 8/2014 | Shen | ..................... | H01B 11/00 |
| | | | | 174/102 R |
| 2016/0020002 A1* | 1/2016 | Feng | ..................... | H01B 11/20 |
| | | | | 174/103 |
| 2016/0205816 A1* | 7/2016 | Inoue | .................... | H01B 7/041 |
| | | | | 174/115 |
| 2016/0225488 A1* | 8/2016 | Pon | ........................ | H01B 9/003 |

FOREIGN PATENT DOCUMENTS

| | | | | |
|---|---|---|---|---|
| JP | 64-020986 | * | 7/1997 | ................ B25J 9/22 |
| JP | 2012-8598 A | | 1/2012 | |
| JP | 2013-111697 A | | 6/2013 | |
| JP | 2013-211829 A | | 10/2013 | |
| JP | 2016-162653 A | | 9/2016 | |

* cited by examiner

INTRINSICALLY SAFE EXPLOSION-PROOF COMPOUND CABLE, SIGNAL PROCESSOR PROVIDED WITH THE INTRINSICALLY SAFE EXPLOSION-PROOF COMPOUND CABLE, TEACH PENDANT PROVIDED WITH THE INTRINSICALLY SAFE EXPLOSION-PROOF COMPOUND CABLE, AND ROBOT PROVIDED WITH THE INTRINSICALLY SAFE EXPLOSION-PROOF COMPOUND CABLE

TECHNICAL FIELD

The present disclosure relates to an intrinsically safe explosion-proof compound cable, a signal processor provided with the intrinsically safe explosion-proof compound cable, a teach pendant provided with the compound cable, and a robot provided with the compound cable.

BACKGROUND ART

Conventionally, intrinsically safe explosion-proof cables are known (for example, see paragraph [0026] of Patent Document 1).

In a radio communication system of Patent Document 1, a signal which satisfies the intrinsic safety explosion-proof standard by an insulated barrier is outputted to a 2-wire cable as an intrinsically safe explosion-proof cable. Thus, the intrinsic safety explosion-proof is achieved.

REFERENCE DOCUMENT OF CONVENTIONAL ART

Patent Document

[Patent Document 1] JP2013-211829A

DESCRIPTION OF THE DISCLOSURE

Problems to be Solved by the Disclosure

In the conventional radio communication system, since the intrinsically safe explosion-proof cable is comprised of the single 2-wire cable, the 2-wire cable itself does not require a special structure resulting from the intrinsic safety explosion-proof standard. However, in case of a compound cable containing a plurality of 2-wire cables, a special structure for satisfying the intrinsic safety explosion-proof standard is required, and it was found that the waveform of a signal transmitted through the 2-wire cables may become blunt due to the special structure.

The present disclosure is made to solve such a problem, and one purpose thereof is to provide an intrinsically safe explosion-proof compound cable, a teach pendant provided with the compound cable, and a robot provided with the compound cable, which can prevent that a transmitted signal becomes blunt.

SUMMARY OF THE DISCLOSURE

The present inventors acquired the following knowledge during the examination process in order to solve the problem described above. To satisfy the intrinsic safety explosion-proof standard for the compound cable, a signal which satisfies the intrinsic safety explosion-proof standard must be supplied by a barrier circuit to cables which constitute the compound cable (hereinafter, referred to as "unit cables"), and in order to prevent energy leak between the unit cables (short circuit), the unit cables must be mutually separated by shields. However, it was found that, when a signal at a notably high frequency is supplied to the shielded unit cable, the signal waveform becomes blunt. This is thought that the shielded unit cable has a large capacitance compared with an unshielded unit cable.

Regarding this knowledge, the present inventors focused on that, when mutually separating a plurality of unit cables by shields, at least one of the unit cables is not necessary to be shielded, and even if there are a plurality of unit cables, when the plurality of unit cables are regulated as a whole in the supplied signal or power (energy) by a common (single) barrier circuit, it is not necessary to separate the plurality of unit cables by shields. Moreover, they focused on that the signal or power transmitted through the unit cables have mutually different frequencies. According to this focused point, if one of the plurality of unit cables which transmits the signal or power at the highest frequency (hereinafter, referred to as the highest-frequency unit cable) is not shielded, the compound cable satisfies the intrinsic safety explosion-proof standard, and it is prevented that the signal transmitted through the highest-frequency unit cable becomes blunt. Further, if the signal or power transmitted through the plurality of given unit cables including the highest-frequency unit cable is regulated by the common barrier circuit, it is unnecessary to shield the plurality of given unit cables including the highest-frequency unit cable, and it is more suitably prevented that the signal transmitted through the compound cable becomes blunt. The present disclosure is made based on such knowledge and focused points.

An explosion-proof compound cable according to one aspect of the present disclosure includes a plurality of unit cables, each of the unit cables configured to transmit a signal or power, the plurality of unit cables include one or more shielded cables each having a shield layer and one or more unshielded cables without the shield layer, and at least a highest-frequency unit cable that is the unit cable configured to transmit the signal or power at the highest frequency among the plurality of unit cables is the unshielded cable.

Further, an intrinsically safe explosion-proof compound cable according to another aspect of the present disclosure includes a plurality of unit cables, each of the unit cables configured to transmit a signal or power that satisfies an intrinsic safety explosion-proof standard, the plurality of unit cables include one or more shielded cables having a shield layer and one or more unshielded cables without the shield layer, and at least a highest-frequency unit cable that is the unit cable configured to transmit the signal or power at the highest frequency among the plurality of unit cables is the unshielded cable.

According to this configuration, since the highest-frequency unit cable that is the unit cable configured to transmit the signal or power at the highest frequency among the plurality of unit cables is not shielded, the compound cable satisfies the intrinsic safety explosion-proof standard and it can be prevented that the signal transmitted by the highest-frequency unit cable becomes blunt. As a result, the intrinsically safe explosion-proof compound cable which can prevent the transmitted signal from becoming blunt, can be provided.

The signal or power transmitted through predetermined unit cables among the plurality of unit cables may satisfy the intrinsic safety explosion-proof standard by the predetermined unit cables as a whole, the predetermined unit cables including the highest-frequency unit cable, and each of the predetermined unit cables including the highest-frequency unit cable may be the unshielded cable.

According to this configuration, since the plurality of given unit cables including the highest-frequency unit cable are not shielded, it can further suitably be prevented that the signal transmitted by the compound cable becomes blunt.

The compound cable may be provided with a shield layer covering all of the unit cables.

According to this configuration, it can suitably be prevented that electromagnetic waves leak from the compound cable.

The compound cable may be a cable configured to connect a first signal processor provided with a plurality of signal-processing circuits and a second signal processor provided with a plurality of signal-processing circuits, and the plurality of unit cables may be configured to connect the plurality of signal-processing circuits of the first signal processor with the plurality of signal-processing circuits of the second signal processor.

According to this configuration, the signal processor including the intrinsically safe explosion-proof compound cable which can prevent the transmitted signal from becoming blunt, can be provided.

The compound cable may be a cable configured to connect a teach pendant as the first signal processor with a control device of a robot as the second signal processor.

According to this configuration, the teach pendant including the intrinsically safe explosion-proof compound cable which can prevent the transmitted signal from becoming blunt, can be provided.

The compound cable may include a first unit cable configured to transmit an image signal for an image circuit, a second unit cable configured to transmit power of a power source for the image circuit, and a third unit cable configured to transmit a signal and power of the power source for a CPU circuit, a fourth unit cable configured to transmit power of the power source for a back-light circuit, a fifth unit cable configured to transmit a signal for an enabling switch circuit, and a sixth unit cable configured to transmit a signal for an emergency-stop switch circuit. The first unit cable may be, or the first unit cable and the second unit cable may be the unshielded cables.

According to this configuration, since it is prevented that the signal becomes blunt even if the frequency of the image signal for the image circuit is high, the display screen of the teach pendant can be made legible, for example, by adopting a TFT liquid crystal which requires high-speed communications.

The compound cable may be a cable configured to connect a robot as the first signal processor with a control device of the robot as the second signal processor.

According to this configuration, the robot including the intrinsically safe explosion-proof compound cable which can prevent the transmitted signal from becoming blunt, can be provided.

The compound cable may include a seventh unit cable configured to transmit a signal for an encoder which detects a rotational angle of a motor configured to drive a joint of the robot, an eighth unit cable configured to transmit a signal for a limit switch provided to the robot, and a ninth unit cable configured to transmit a signal for a pressure switch provided to the robot. The seventh unit cable may be the unshielded cable.

According to the configuration, since it is prevented that the signal becomes blunt even if the frequency of the signal for the encoder which detects the rotational angle of the motor configured to drive the joint of the robot is high, the detection accuracy of the encoders can be improved.

Moreover, a signal processor including the intrinsically safe explosion-proof compound cable according to still another aspect of the present disclosure includes the compound cable and the first signal processor.

Moreover, a teach pendant including the intrinsically safe explosion-proof compound cable according to still another aspect of the present disclosure includes the compound cable and the teach pendant.

Moreover, a robot including the intrinsically safe explosion-proof compound cable according to still another aspect of the present disclosure includes the compound cable and the robot.

Effect of the Disclosure

According to the present disclosure, it can provide the intrinsically safe explosion-proof compound cable, the signal processor provided with the compound cable, the teach pendant provided with the compound cable, and the robot provided with the compound cable, which can prevent the transmitted signal from becoming blunt.

MODES FOR CARRYING OUT THE DISCLOSURE

Figure 1:
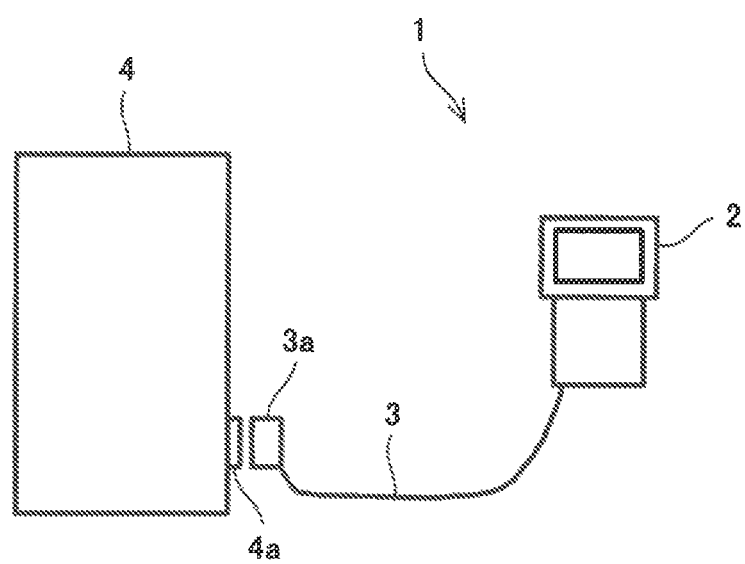
FIG. 1 is a view schematically illustrating a use mode of a teach pendant provided with an intrinsically safe explosion-proof compound cable according to Embodiment 1 of the present disclosure.

Hereinafter, embodiments of the present disclosure are described with reference to the accompanying drawings. Note that, throughout the drawings, the same or corresponding elements are denoted by the same reference characters to omit redundant description.

Embodiment 1

[Configuration]

FIG. 1 is a view schematically illustrating a use mode of a teach pendant provided with an intrinsically safe explosion-proof compound cable according to Embodiment 1 of the present disclosure.

Referring to FIG. 1, a teach pendant 1 provided with the intrinsically safe explosion-proof compound cable (hereinafter, simply referred to as "the compound cable") includes a teach pendant 2 and a compound cable 3. One end of the compound cable 3 is directly connected to the teach pendant 2. A connector 3a is provided to the other end part of the compound cable 3. The connector 3a is connected to a connector 4a of a robot controller 4. The robot controller 4 is a device which controls an explosion-proof robot 6 (see FIG. 4).

Figure 2:
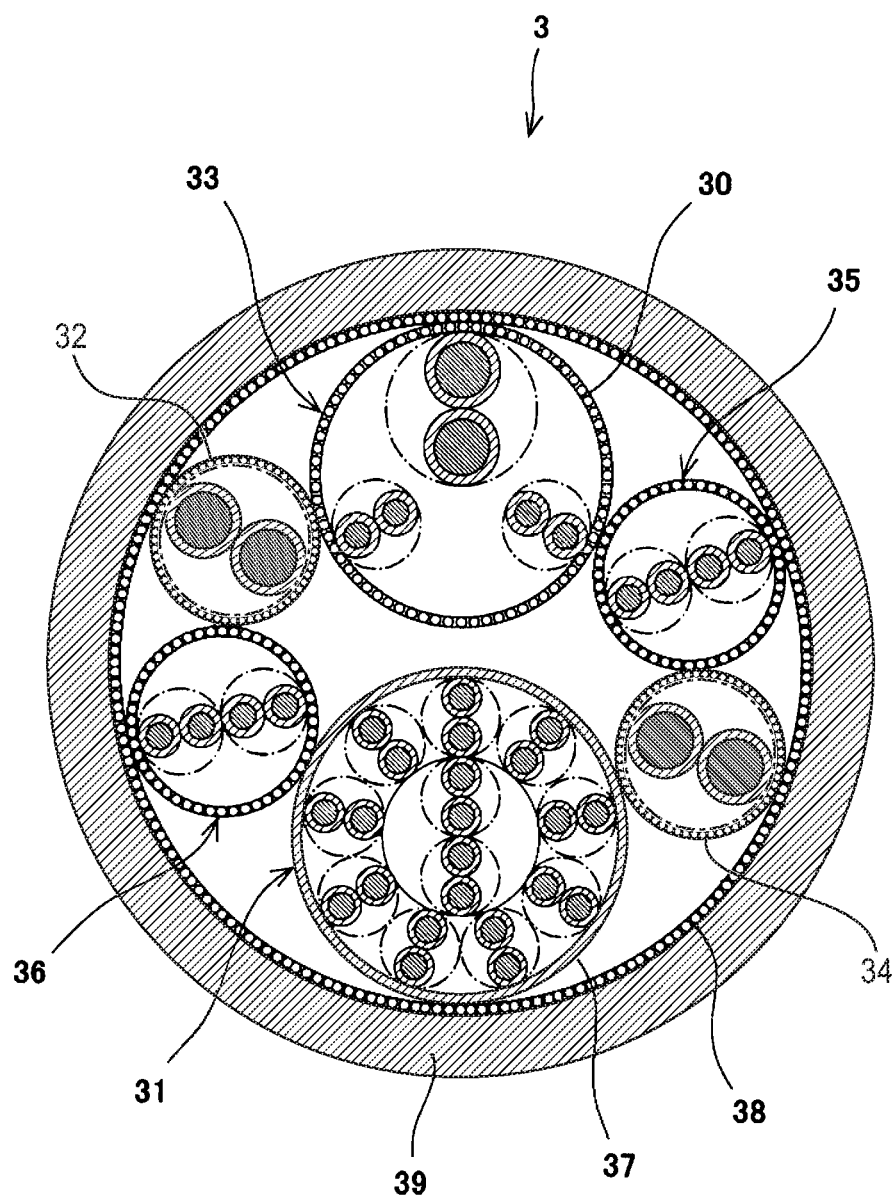
FIG. 2 is a cross-sectional view illustrating a structure of the compound cable of FIG. 1.

FIG. 2 is a cross-sectional view illustrating a structure of the compound cable of FIG. 1.

Referring to FIG. 2, the compound cable 3 includes a plurality of unit cables 31-36 which respectively transmits a signal or power which satisfies an intrinsic safety explosion-proof standard. The plurality of unit cables 31-36 include shielded cables each having a shield layer 30, and unshielded cables without the shield layer 30. At least the highest-frequency unit cable which is a unit cable for transmitting a signal or power at the highest frequency among the plurality of unit cables 31-36 is the unshielded cable.

For example, the compound cable 3 includes a first unit cable 31 which transmits an image signal for an image circuit, a second unit cable 32 which transmits power of a power source for the image circuit, a third unit cable 33 which transmits a signal and power of the power source for a CPU circuit, a fourth unit cable 34 which transmits power of the power source for a back-light circuit, a fifth unit cable 35 which transmits a signal for an enabling switch circuit, and a sixth unit cable 36 which transmits a signal for an emergency-stop switch circuit. Here, the first unit cable 31 which transmits the image signal for the image circuit is the highest-frequency unit cable. Here, the image signal for the image circuit is at the maximum of 25 MHz, for example. Only the first unit cable 31 is the unshielded cable.

In FIG. 2, each circle of one-dot chain line indicates a 2-wire cable. Correctly, each circle of the one-dot chain line illustrates an envelope of the twisted perimeter of a twisted line or cable seen in the longitudinal direction. The 2-wire cable is constructed by twisting a pair of insulated conductor lines. Each of the unit cables 31-36 contains one or more 2-wire cables. The unit cables 31, 33, and 35 containing the plurality of 2-wire cables are constructed by twisting the plurality of 2-wire cables. The insulating layers of the insulated conductor lines of the unit cables 32-36 are made of a suitable insulating material (for example, FEP). On the other hand, the insulating layers of the insulated conductor lines of the unit cable 31 may be desirably made of an insulating material with a small dielectric constant (for example, ETFE). This is to make the capacitance of the unit cable 31 as small as possible.

In each of the unit cables 32-36 which are shielded cables, one or more 2-wire cables twisted as described above is covered with an individual shield layer 30. The individual shield layer 30 may be a conductor layer. Here, the shield layer 30 is a braided layer of copper wires. In the first unit cable 31 which is the unshielded cable, one or more (here, eleven) 2-wire cables twisted as described above is covered with an insulating layer 37. Here, the insulating layer 37 is comprised of a PET tape wound around the perimeter of the twisted 2-wire cable.

All the unit cables 31-36 are twisted, and the twisted unit cables 31-36 are covered with an entire shield layer 38. The entire shield layer 38 may be a conductor layer. Here, the entire shield layer 38 is a braided layer of copper wires.

The unit cables 31-36 covered with the entire shield layer 38 are further covered with a sheath 39 made of an insulating material. The insulating material of the sheath 39 may be polyurethane elastomer, for example.

Figure 3:
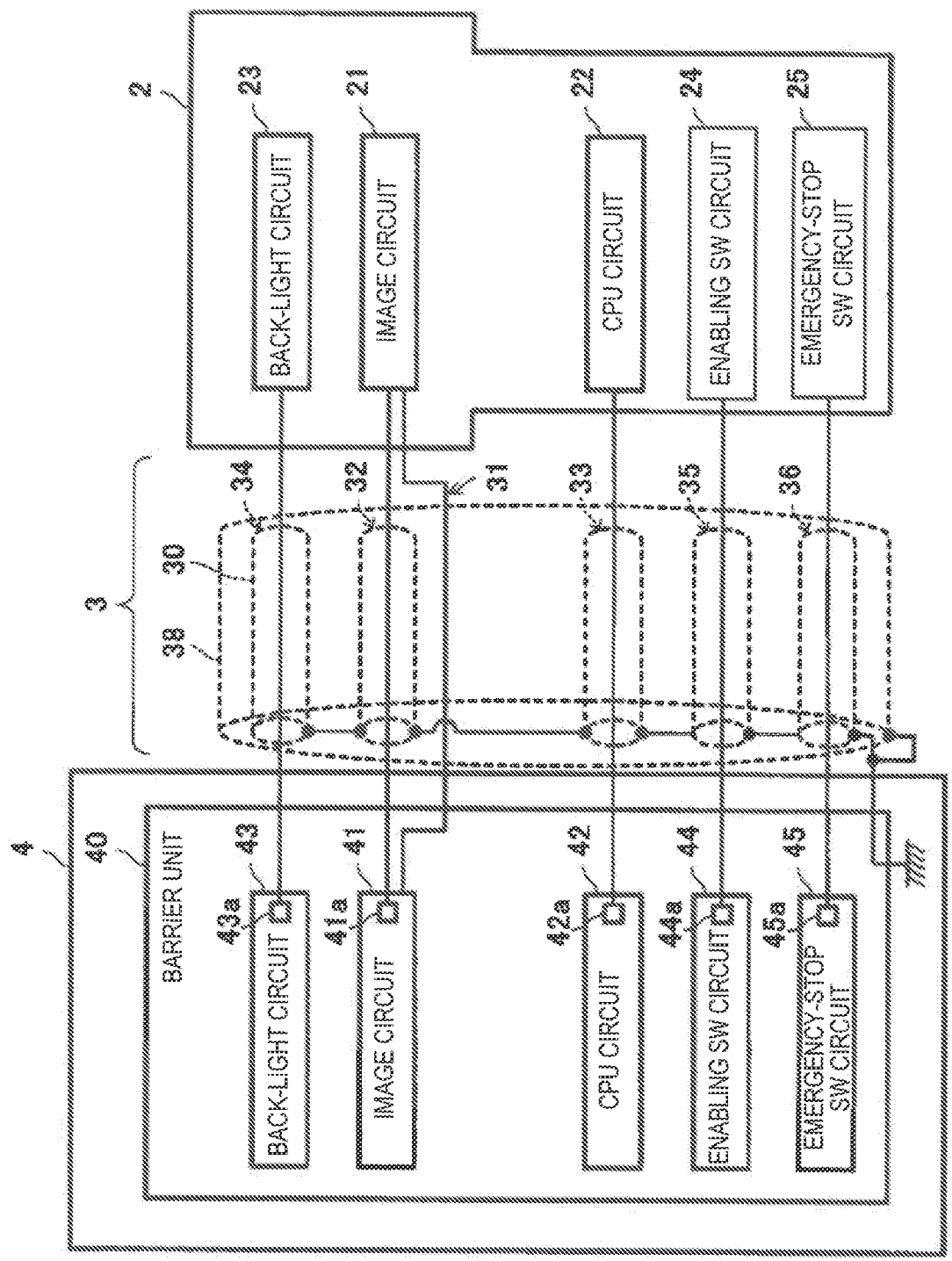
FIG. 3 is a circuit diagram illustrating senders and receivers of signals or power transmitted through the compound cable of FIG. 1.

FIG. 3 is a circuit diagram illustrating senders and receivers of the signals or power transmitted through the compound cable of FIG. 1.

Referring to FIG. 3, the robot controller 4 includes a barrier unit 40. The barrier unit 40 includes an image circuit 41, a CPU circuit 42, a back-light circuit 43, an enabling SW circuit 44, and an emergency-stop SW circuit 45. Moreover, the barrier unit 40 includes barrier circuits 41a-45a for these circuits, respectively.

The teach pendant 2 includes an image circuit 21, a CPU circuit 22, a back-light circuit 23, an enabling SW circuit 24, and an emergency-stop SW circuit 25. The image circuit 21 includes a display part (not illustrated) for the teach pendant 2. This display part includes a liquid crystal panel using TFT liquid crystal, for example. The back-light circuit 23 includes a back light for the liquid crystal panel in the display part. The enabling SW circuit 24 includes an enabling switch (not illustrated). The emergency-stop SW circuit 25 includes an emergency-stop switch (not illustrated).

In the compound cable 3, the first unit cable 31 and the second unit cable 32 connect the image circuit 41 of the barrier unit 40 with the image circuit 21 of the teach pendant 2, the third unit cable 33 connects the CPU circuit 42 of the barrier unit 40 with the CPU circuit 22 of the teach pendant 2, the fourth unit cable 34 connects the back-light circuit 43 of the barrier unit 40 with the back-light circuit 23 of the teach pendant 2, the fifth unit cable 35 connects the enabling SW circuit 44 of the barrier unit 40 with the enabling SW circuit 24 of the teach pendant 2, and the sixth unit cable 36 connects the emergency-stop SW circuit 45 of the barrier unit 40 with the emergency-stop SW circuit 25 of the teach pendant 2. The individual shield layers 30 of the second to sixth unit cables 32-36 and the entire shield layer 38 are grounded.

In the barrier unit 40, the image circuit 41 outputs the power of the power source for the image circuit of the teach pendant 2 and the image signal of the image to be displayed on the display part of the teach pendant 2 to the second unit cable 32 and the first unit cable 31, respectively. The image signal and the power of the power source for the image circuit are regulated by the barrier circuit 41a for the image circuit so that the intrinsic safety explosion-proof standard is satisfied.

The CPU circuit 42 outputs the power of the power source for the CPU circuit of the teach pendant 2 and a given control signal (command) to the third unit cable 33. Moreover, the CPU circuit 42 receives the given control signal (command) from the CPU circuit 22 of the teach pendant 2 through the third unit cable 33, and controls the robot 6 (see FIG. 4) according to the control signal. Both control signals and the power of the power source for the CPU circuit are regulated by the barrier circuit 42a for the CPU circuit so that the intrinsic safety explosion-proof standard is satisfied.

The back-light circuit 43 outputs the power of the power source for the back light of the display part of the teach pendant 2 to the fourth unit cable 34. The power of the power source for the back light is regulated by the barrier circuit 43a for the back-light circuit so that the intrinsic safety explosion-proof standard is satisfied.

The enabling SW circuit 44 outputs the signal for the enabling switch circuit which controls the enabling switch of the teach pendant 2 to the fifth unit cable 35. The signal for the enabling switch circuit is regulated by the harrier circuit 44a for enabling SW circuit so that the intrinsic safety explosion-proof standard is satisfied.

The emergency-stop SW circuit 45 outputs the signal for the emergency-stop switch circuit which controls the emergency-stop switch of the teach pendant 2 to the sixth unit cable 36. The signal for the emergency-stop switch circuit is regulated by the barrier circuit 45a for the emergency-stop SW circuit so that the intrinsic safety explosion-proof standard is satisfied.

In the teach pendant 2, the image circuit 21 receives the power of the power source and the image signal for the image circuit through the second unit cable 32 and the first unit cable 31, respectively. The image circuit 21 operates using the received power of the power source, and based on the received image signal, displays an image on the display part of the teach pendant 2.

The CPU circuit 22 receives the power of the power source for the CPU circuit and a given control signal (command) through the third unit cable 33. The CPU circuit 22 operates using the received power of the power source, and according to the received given control signal (command), controls the teach pendant 2. Moreover, the CPU circuit 22 outputs the given control signal (command) which controls the robot 6 to the third unit cable 33.

The back-light circuit 23 receives the power of the power source for the back light through the fourth unit cable 34, and turns on the back light of the display part of the teach pendant 2 using the power of the power source.

The enabling SW circuit 24 receives the signal for the enabling switch circuit through the fifth unit cable 35, and controls the enabling switch of the teach pendant 2 according to the received signal.

The emergency-stop SW circuit 25 receives the signal for the emergency-stop switch circuit through the sixth unit cable 36, and controls the emergency-stop switch of the teach pendant 2 according to the received signal.

[Operation]

Next, operation of the teach pendant provided with the intrinsically safe explosion-proof compound cable described above will be described using FIGS. 1 to 3.

Referring to FIGS. 1 to 3, in the compound cable 3, the second to sixth unit cables 32-36 among the first to sixth unit cables 31-36 each has the individual shield layer 30 in the outermost layer, and is grounded. Therefore, the second to sixth unit cables 32-36 are separated from each other. Although the first unit cable 31 does not have the individual shield layer in the outermost layer, it is separated by the individual shield layers 30 in the outermost layers of the second to sixth unit cables 32-36 from the second to sixth unit cables 32-36. Therefore, mutual energy leak can be prevented for all the first to sixth unit cables 31-36.

Since the first unit cable 31 which is the highest-frequency unit cable is not shielded, the capacitance of the first unit cable 31 becomes smaller than a case where all the first to sixth unit cables 31-36 are shielded, and to the extent, it can prevent that the signal transmitted by the highest-frequency unit cable 31 becomes blunt. For example, since it is prevented that the image signal becomes blunt even if the frequency of the image signal for the image circuit is high, the display screen of the teach pendant 2 can be made legible, for example, by adopting the TFT liquid crystal which requires high-speed communications. As a result, the teach pendant 2 provided with the intrinsically safe explosion-proof compound cable 3 which can prevent that the transmitted signal becomes blunt can be provided. Further, it is suitably prevented by the entire shield layer 38 that electromagnetic waves leak from the compound cable 3.

[Modification 1]

Modification 1 of Embodiment 1 illustrates a mode in which, in Embodiment 1, the signals or power transmitted through a plurality of given unit cables including the highest-frequency unit cable satisfy the intrinsic safety explosion-proof standard of the plurality of given unit cables as a whole, and the plurality of given unit cables including the highest-frequency unit cable are unshielded cables.

Referring to FIG. 2, in Modification 1, the first unit cable 31 and the second unit cable 32 are comprised of the unshielded cables without the individual shield layers 30.

Referring to FIG. 3, according to this structure, the first unit cable 31 and the second unit cable 32 are regulated as a whole by the barrier circuit 41*a* for the image circuit of the barrier unit 40 so that the supplied signals and power satisfy the intrinsic safety explosion-proof standard. Therefore, even if the first unit cable 31 and the second unit cable 32 are short-circuited, the cables are regulated so that the energy which flows through the first unit cable 31 and the second unit cable 32 satisfies the intrinsic safety explosion-proof standard by the barrier circuit 41*a* for the image circuit of the barrier unit 40.

According to this structure, since the second unit cable 32 does not have the grounded shield layer in the outermost layer, the capacitance of the first unit cable 31 decreases compared with the case where the second unit cable 32 has the grounded shield layer in the outermost layer. Therefore, to the extent, it can further be prevented that the image signal transmitted through the first unit cable becomes blunt. In addition, the cost required for the individual shield layer of the second unit cable 32 can be saved.

[Modification 2]

Referring to FIG. 2, the entire shield layer 38 is omitted in Modification 2 of Embodiment 1. Such a form is permitted in an environment where leakage of the electromagnetic waves from the compound cable 3 does not become a problem. According to this structure, the cost required for the entire shield layer can be saved.

Embodiment 2

Figure 4:
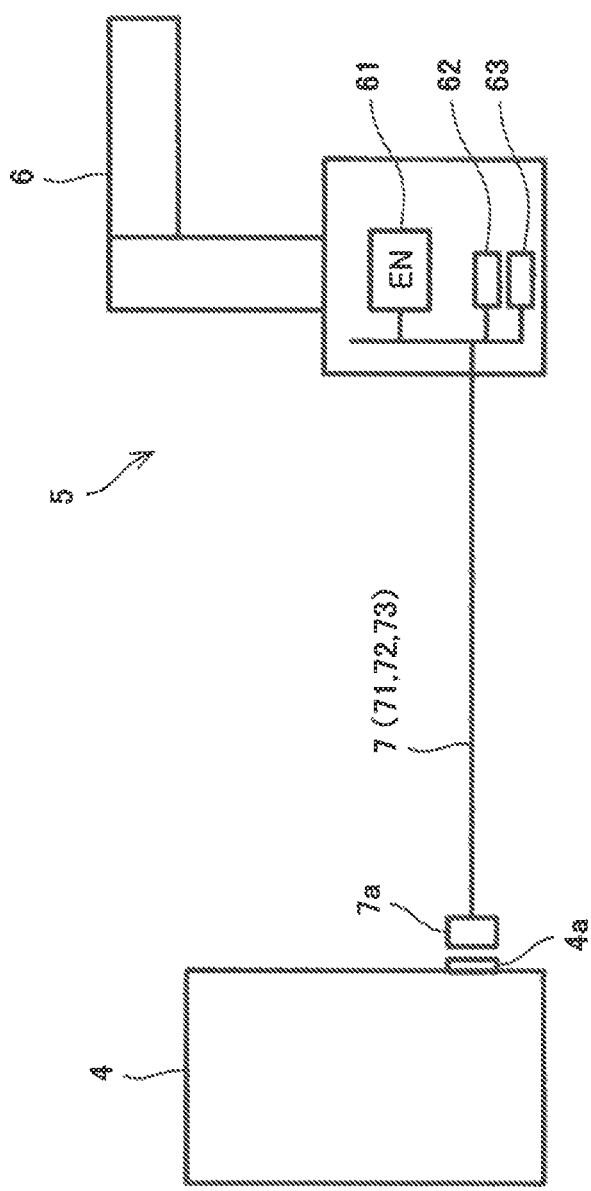
FIG. 4 is a view schematically illustrating a use mode of a robot provided with an intrinsically safe explosion-proof compound cable according to Embodiment 2 of the present disclosure.

FIG. 4 is a view schematically illustrating a use mode of a robot provided with an intrinsically safe explosion-proof compound cable according to Embodiment 2 of the present disclosure.

Referring to FIG. 4, a robot 5 provided with the intrinsically safe explosion-proof compound cable (hereinafter, simply referred to as "the compound cable") includes an explosion-proof robot (hereinafter, simply referred to as "the robot") 6 and a compound cable 7. One end of the compound cable 7 is directly connected to the robot 6. A connector 7*a* is provided to the other end part of the compound cable 7. The connector 7*a* is connected to a connector 4*a* of a robot controller 4.

Compared with the compound cable 3 of Embodiment 1, the structure of the compound cable 7 is similar to that of the compound cable 3 of Embodiment 1 except for the number of unit cables and the number of 2-wire cables which constitute the unit cable. Therefore, such a difference will be described.

The compound cable 7 includes a seventh unit cable 71 which transmits signals for encoders which detect rotational angles of motors which drive joints of the robot 6, an eighth unit cable 72 which transmits a signal for a limit switch provided to the robot 6, and a ninth unit cable 73 which transmits a signal for a pressure switch provided to the robot 6.

The seventh unit cable 71 which transmits the signals for the encoders is the highest-frequency unit cable. The signals for the encoders are the maximum of 4 MHz, for example. The seventh unit cable 71 is an unshielded cable.

The robot controller 4 includes a barrier unit (not illustrated). The barrier unit includes an encoder circuit (not illustrated), a limit SW circuit (not illustrated), and a pressure SW circuit (not illustrated). Moreover, the barrier unit includes a barrier circuit for these circuits.

Here, the robot 6 is an explosion-proof robot, where an arm is constructed in the form of a container, and the pressure inside the container is maintained higher than the pressure outside the container. The robot 6 includes an encoder circuit 61, a limit SW circuit 62, and a pressure SW circuit 63. The encoder circuit 61 includes the encoders which detect the rotational angles of the motors which drive the joints of the robot 6. The limit SW circuit 62 includes a limit switch provided to each joint, in order to limit a movable range of the robot 6. The pressure SW circuit 63 includes a pressure switch which detects a reduction in the pressure inside the container of the robot 6.

In the compound cable 7, the seventh unit cable 71 connects the encoder circuit of the barrier unit with the encoder circuit 61 of the robot 6, the eighth unit cable 72 connects the limit SW circuit of the barrier unit with the limit SW circuit 62 of the robot 6, and the ninth unit cable 73 connects the pressure SW circuit of the barrier unit with the pressure SW circuit 63 of the robot 6. The individual shield layers of the seventh to ninth unit cables 71-73 and the entire shield layer are grounded (not illustrated).

The signals for the encoders transmitted through the seventh unit cable 71, the signal for the limit switch transmitted through the eighth unit cable 72, and the signal for the pressure switch transmitted through the ninth unit cable 73 are regulated by the barrier circuit for the encoder circuit, the barrier circuit for the limit SW circuit, and the barrier circuit for the pressure SW circuit so that the intrinsic safety explosion-proof standard is satisfied, respectively.

According to such Embodiment 2, since it is prevented that the signals become blunt even if the frequency of the signals for the encoders which detect the rotational angles of the motors which drive the joints of the robot 6 is high, the detection accuracy of the encoders can be improved.

As a result, the robot 6 provided with the intrinsically safe explosion-proof compound cable which can prevent that the transmitted signal becomes blunt can be provided.

Embodiment 3

Although in Embodiments 1 and 2 the teach pendant provided with the intrinsically safe explosion-proof compound cable, and the robot provided with the intrinsically safe explosion-proof compound cable are illustrated, respectively, the present disclosure is not limited to these configurations, and is applicable to a signal processor provided with the intrinsically safe explosion-proof compound cable. That is, the teach pendant 2, the robot 6, and the robot controller 4 in Embodiments 1 and 2 are illustration of the signal processor provided with a plurality of signal-processing circuits. In this case, the compound cable is a cable to connect a first signal processor provided with a plurality of signal-processing circuits with a second signal processor provided with a plurality of signal-processing circuits, and a plurality of unit cables are to connect the plurality of signal-processing circuits of the first signal processor with the plurality of signal-processing circuits of the second signal processor.

According to such Embodiment 3, the signal processor provided with the intrinsically safe explosion-proof compound cable which can prevent that the transmitted signal becomes blunt can be provided.

Other Embodiments

In Embodiment 2 or 3, similar to Modification of Embodiment 1, the first unit cable 31 and the second unit cable 32 may be constructed to be unshielded cables without the individual shield layers 30.

Moreover, in Embodiment 2 or 3, similar to Modification 2 of Embodiment 1, the entire shield layer 38 may be omitted.

It is apparent for a person skilled in the art that many improvements and other embodiments of the present disclosure are possible from the above description. Therefore, the above description is to be interpreted only as illustration, and it is provided in order to teach a person skilled in the art the best mode that implements the present disclosure. The details of the structures and/or the functions may substantially be changed without departing from the spirit of the present disclosure.

INDUSTRIAL APPLICABILITY

The present disclosure is useful for the intrinsically safe explosion-proof compound cable, the signal processor provided with the intrinsically safe explosion-proof compound cable, the teach pendant provided with the compound cable, and the robot provided with the compound cable, which can prevent that the transmission signal becomes blunt.

DESCRIPTION OF REFERENCE CHARACTERS

1 Teach Pendant Provided with Intrinsically Safe Explosion-proof Compound Cable
2 Teach Pendant
3 Compound Cable
3a Connector
4 Robot Controller
4a Connector
5 Robot Provided with Intrinsically Safe Explosion-proof Compound Cable
6 Robot
7 Compound Cable
7a Connector
21 Image Circuit
22 CPU Circuit
23 Back-light Circuit
24 Enabling SW Circuit
25 Emergency-stop SW Circuit
30 Individual Shield Layer
31 First Unit Cable
32 Second Unit Cable
33 Third Unit Cable
34 Fourth Unit Cable
35 Fifth Unit Cable
36 Sixth Unit Cable
37 Insulating Layer
38 Entire Shield Layer
39 Sheath
40 Barrier Unit
41 Image Circuit
42 CPU Circuit
43 Back-light Circuit
44 Enabling SW Circuit
45 Emergency-stop SW Circuit
61 Encoder Circuit
62 Limit SW Circuit
63 Pressure SW Circuit
71 Seventh Unit Cable 72 Eighth Unit Cable
73 Ninth Unit Cable

The invention claimed is:

1. An intrinsically safe explosion-proof compound cable comprising a plurality of unit cables being configured to transmit a signal or power regulated by a plurality of barrier circuits, the plurality of unit cables including one or more shielded cables having a shield layer and one or more unshielded cables without the shield layer, wherein:
  at least a highest-frequency unit cable that is the unit cable configured to transmit the signal or power at the highest frequency among the plurality of unit cables is the unshielded cable,
  all of the one or more unshielded cables among the plurality of unit cables are configured to transmit the signal or power regulated by only one of the plurality of barrier circuits, and
  the one or more shielded cables that are the other unit cables are configured to transmit the signal or power regulated by the other barrier circuits.

2. The intrinsically safe explosion-proof compound cable of claim 1, wherein the compound cable is provided with a shield layer covering all of the unit cables.

3. The intrinsically safe explosion-proof compound cable claim 1, wherein:
  the compound cable is a cable configured to connect a first signal processor provided with a plurality of signal-processing circuits and a second signal processor provided with a plurality of signal-processing circuits, and
  the plurality of unit cables are configured to connect the plurality of signal-processing circuits of the first signal processor with the plurality of signal-processing circuits of the second signal processor.

4. The intrinsically safe explosion-proof compound cable of claim 3, wherein the compound cable is a cable configured to connect a teach pendant as the first signal processor with a control device of a robot as the second signal processor.

5. The intrinsically safe explosion-proof compound cable of claim 4,
  wherein the compound cable includes
    a first unit cable configured to transmit an image signal for an image circuit,
    a second unit cable configured to transmit power of a power source for the image circuit, and
    a third unit cable configured to transmit a signal and power of the power source for a CPU circuit,
    a fourth unit cable configured to transmit power of the power source for a back-light circuit,
    a fifth unit cable configured to transmit a signal for an enabling switch circuit, and
    a sixth unit cable configured to transmit a signal for an emergency-stop switch circuit, and
  wherein the first unit cable is, or the first unit cable and the second unit cable are the unshielded cables.

6. A teach pendant comprising the intrinsically safe explosion-proof compound cable provided with the compound cable and the teach pendant of claim 4.

7. The intrinsically safe explosion-proof compound cable of claim 3, wherein the compound cable is a cable configured to connect a robot as the first signal processor with a control device of the robot as the second signal processor.

8. The intrinsically safe explosion-proof compound cable of claim 7,
  wherein the compound cable includes
    a seventh unit cable configured to transmit a signal for an encoder which detects a rotational angle of a motor configured to drive a joint of the robot,
    an eighth unit cable configured to transmit a signal for a limit switch provided to the robot, and
    a ninth unit cable configured to transmit a signal for a pressure switch provided to the robot, and
  wherein the seventh unit cable is the unshielded cable.

9. A robot comprising the intrinsically safe explosion-proof compound cable provided with the compound cable and the robot of claim 7.

10. A signal processor comprising the intrinsically safe explosion-proof compound cable provided with the compound cable of claim 3 and the first signal processor.

11. A communication system comprising the compound cable and the plurality of barrier circuits according to claim 1.

* * * * *